United States Patent [19]

Mahabadi

[11] Patent Number: 4,473,759

[45] Date of Patent: Sep. 25, 1984

[54] POWER SENSING CIRCUIT AND METHOD

[75] Inventor: John K. Mahabadi, Mesa, Ariz.

[73] Assignee: Motorola, Inc., Schaumberg, Ill.

[21] Appl. No.: 370,886

[22] Filed: Apr. 22, 1982

[51] Int. Cl.³ .................................................. H03K 5/153
[52] U.S. Cl. ................................... 307/350; 307/355;
307/592; 307/296 R
[58] Field of Search ............... 307/296, 494, 350, 355,
307/592, 357

[56] References Cited

U.S. PATENT DOCUMENTS 3,965,388  6/1976  Brisk ................................... 307/355
4,282,489  8/1981  DeRienzo ........................... 307/355
4,297,599  10/1981  Werner et al. ...................... 307/355

Primary Examiner—Stanley D. Miller
Assistant Examiner—B. P. Davis
Attorney, Agent, or Firm—William J. Kubida

[57] ABSTRACT

A power sensing circuit and method responsive to applied circuit voltages such that subsequent circuitry will be immediately powered down when the applied voltage drops below a specified level and generating a predetermined delay for powering up the subsequent circuitry when the applied voltage rises back to the same specified level.

12 Claims, 2 Drawing Figures

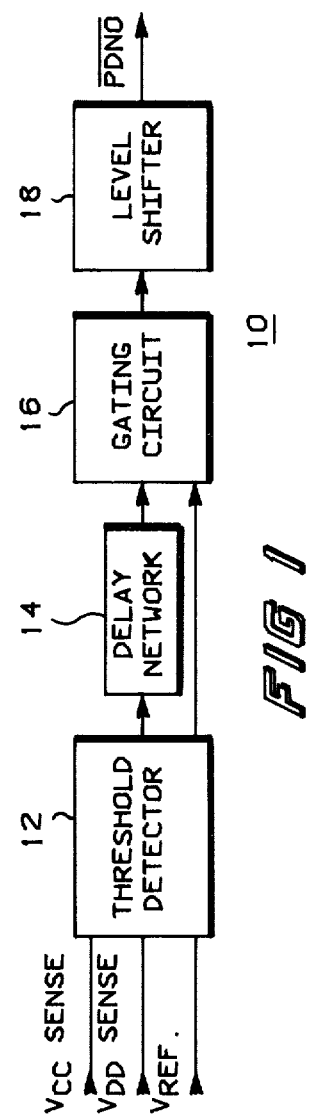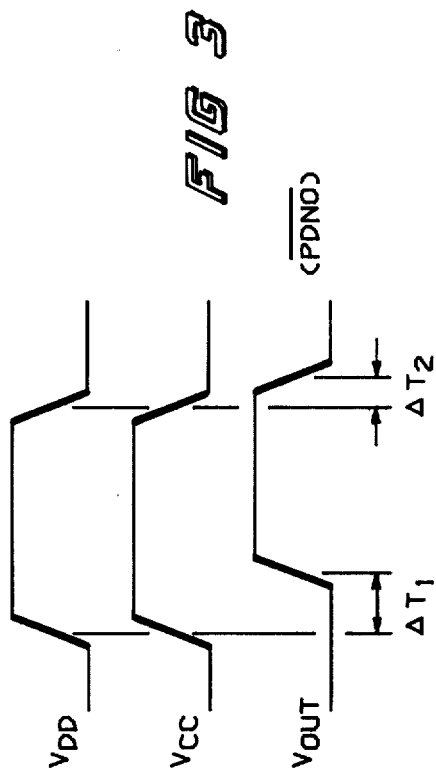

POWER SENSING CIRCUIT AND METHOD

BACKGROUND OF THE INVENTION

In general, the present invention relates to power sensing circuits and methods. More particularly, the invention is of exceptional utility in those applications requiring an accurate response to changes in applied circuit voltages such that subsequent circuitry will be immediately powered down when the applied voltage drops below a specified level but also requiring a predetermined delay for powering up the subsequent circuitry when the applied voltage rises back to the same specified level.

In magnetic bubble memories, the accurate sensing of applied supply voltages is critical and the coil pre-drivers for the magnetic coils used therewith must be powered down immediately upon the fall of supply voltages below a specified level. Typically, bubble memories require both a $V_{DD}$ and $V_{CC}$ sources for their associated CMOS and T²L circuitry, the level of each of which must be accurately monitored. However, a delay is necessary in powering the coil pre-drivers back up upon restoration of the $V_{DD}$ or $V_{CC}$ to the same specified level to insure stability of generation. The length of the delay required is dependent on individual circuit requirements.

Previously, there has been no readily implemented means for both speeding up the power down signal while simultaneously delaying a power up signal for the coil pre-drivers in a magnetic bubble memory system. Particularly, there has been no means for responding as above described with respect to the plurality of voltages necessary in such a system. Moreover, there has previously been disclosed no circuit which could be readily integrated on a conventional semiconductor substrate.

It is therefore an object of the present invention to provide an improved power sensing circuit and method.

It is also an object of the invention to provide an improved power sensing circuit and method which can speed up a power down signal to subsequent circuitry while selectively delaying a power up signal.

It is also an object of the invention to provide an improved power sensing circuit and method which can sense and react to a plurality of supply voltages.

It is also an object of the invention to provide an improved power sensing circuit and method which can be readily integrated onto a semiconductor substrate using standard CMOS technology.

SUMMARY OF THE INVENTION

The foregoing objects are achieved in the present invention wherein a circuit and method is provided rendering an accurate response to changes in applied circuit voltages such that subsequent circuitry will be immediately powered down when the applied supply voltage drops below a specified level but also rendering a predetermined delay for powering up the subsequent circuitry when the applied voltage rises back to the same specified level.

BRIEF DESCRIPTION OF THE DRAWINGS

The above mentioned and other features and objects of the invention and the manner of attaining them will become more apparent and the invention itself will be best understood by reference to the following description of an embodiment of the invention taken in conjunction with the accompanying drawings, wherein:

FIG. 1 is a simplified block diagram of a power sensing circuit according to the present invention for use in conjunction with a T²L output network;

FIG. 3 is a graphic representation of the output voltage of a power sensing circuit according to the present invention showing the relative rise and fall times thereof of the power down output signal ($\overline{PDNO}$) in response to changes in applied supply voltages.

DESCRIPTION OF A PREFERRED EMBODIMENT

Figure 2:
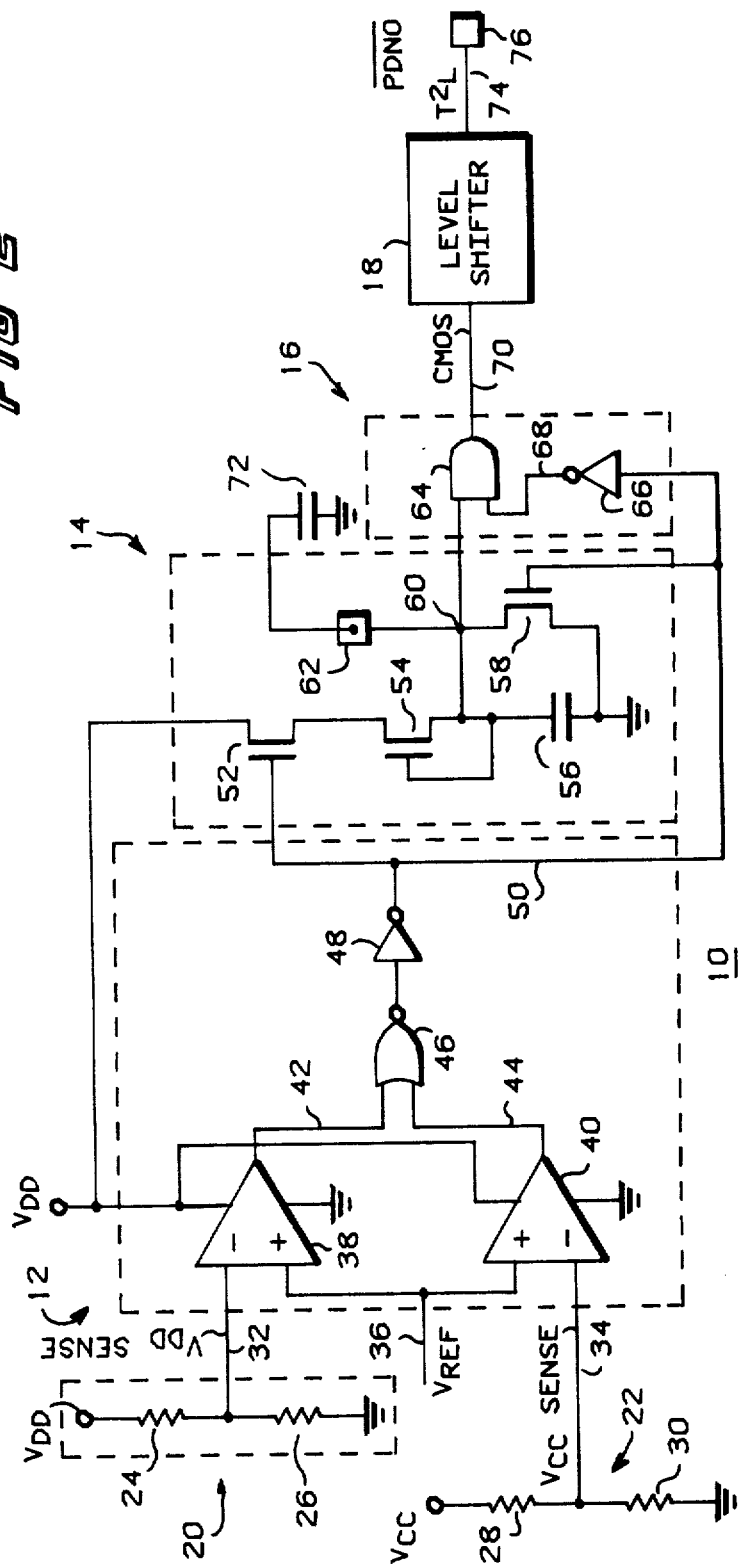
FIG. 2 is a schematic diagram of the power sensing circuit of FIG. 1 providing a more detailed depiction of the threshold detector, delay network and gating circuit.

Referring now to FIGS. 1 and 2, the power sensing circuit 10 of the invention is shown. Power sensing circuit 10 comprises in general a threshold detector 12, a delay network 14 and a gating circuit 16. For applications such as in magnetic bubble memory systems or other circuitry requiring a greater output level, a level shifter 18 may be furnished for changing the power down output signal ($\overline{PDNO}$) from a CMOS level to a T²L level.

Threshold detector 12 has as inputs a reference voltage $V_{REF}$ on $V_{REF}$ line 36, as well as a $V_{CC}$ sense and $V_{DD}$ sense signals on $V_{CC}$ sense line 34 and $V_{DD}$ sense line 32, respectively. The $V_{REF}$ voltage on $V_{REF}$ line 36 may be set by means of a Zener diode and in the application illustrated, may be conveniently furnished as approximately 2.5 volts. $V_{DD}$ voltage divider 20 and $V_{CC}$ voltage divider 22 set $V_{DD}$ sense line 32 and $V_{CC}$ sense line 34 to a level substantially equal to the voltage on $V_{REF}$ line 36 by means of the series connected resistors 24, 26 and 28, 30 respectively. As depicted, $V_{DD}$ voltage divider 20 and $V_{CC}$ voltage divider 22 may be external to the integrated circuitry or integrated therewith on the same chip depending on circuit voltage requirements.

Comparator 38 has as inputs $V_{DD}$ sense line 32 and $V_{REF}$ line 36. Similarly, comparator 40 has as inputs $V_{CC}$ sense line 34 and $V_{REF}$ line 36. Comparators 38 and 40 are connected to both a drain voltage $V_{DD}$ and circuit ground. The outputs of comparators 38 and 40 are applied to comparator output lines 42 and 44 respectively for input to NOR gate 46, the output of which is applied to inverter 48 for subsequent output on threshold line 50.

Threshold line 50 is connected to the gate of P-channel transistor 52 and N-channel transistor 58 as well as the input of inverter 66. P-channel transistor 52 has its source connected to a drain voltage $V_{DD}$ and its drain connected to the source of P-channel transistor 54. P-channel transistor 54 has its gate connected to its drain which is coupled to circuit ground through capacitor 56. Additionally, N-channel transistor 58 has its drain connected to delay output line 60 and its source connected to circuit ground. Delay output line 60 is connected to an optional pad 62 for connection of an external capacitor 72 in parallel with capacitor 56.

The output of delay network 14 comprising P-channel transistors 52 and 54, N-channel transistor 58 and capacitor 56, which output appears on delay output line 60, is supplied as one input to AND gate 64. AND gate 64 also has as another input the output of inverter 66 on output line 68. The output of gating circuit 16 comprising AND gate 64 and inverter 66 is supplied to a conventional level shifter 18 for raising the CMOS voltage levels on line 70 to a T²L level on line 74. On an integrated circuit chip, the power down output signal $\overline{PDNO}$ on line 74 would be applied to an output pad 76 for supplying the signal to external circuitry.

OPERATION IN A POWER DOWN CONDITION:

Upon detecting a drop in voltage level on either $V_{DD}$ sense line 32 or $V_{CC}$ sense line 34, NOR gate 46 will receive a logic "1" input signal from either of comparators 38 or 40 respectively. Upon receiving a logic "1" input on either or both of its input terminals, NOR gate 46 will supply a logic "0" output for input to inverter 48. Inverter 48 in turn will supply a logic "1" input to the gate of P-channel transistor 52, the gate of N-channel transistor 58 and the input of inverter 66. Upon receiving a logic "1" input, P-channel transistor 52 will turn off disconnecting transistor 54 from the drain voltage $V_{DD}$. Simultaneously, the logic "1" input to N-channel transistor 58 will turn the device on allowing capacitor 56 to discharge to circuit ground. Meanwhile, the logic "1" input to inverter 66 causes a logic "0" level to appear at one input terminal of AND gate 64 causing its output to immediately go to a logic "0" level from its previous logic "1" condition. As shown in FIG. 3, this $\Delta T_2$ time period is relatively short due to the by-passing of delay network 14 by the logic "1" level applied to the input of inverter 66. Operation in a Power Up Condition:

When the voltage levels on $V_{DD}$ sense line 32 and $V_{CC}$ sense line 34 are substantially equal to the voltage on $V_{REF}$ line 36, NOR gate 46 will receive logic "0" inputs from both comparators 42 and 44 respectively. Upon receiving logic "0" signal levels to both of its inputs, NOR gate 46 will go to a logic "1" level for input to inverter 48. The output of inverter 48 will then furnish a logic "0" level to the gate of P-channel transistor 52, the gate of N-channel transistor 58 and the input of inverter 66. Upon receiving a logic "0" level at its gate, P-channel transistor 52 will turn on connecting P-channel transistor 54 to a drain supply voltage $V_{DD}$. As P-channel transistor 54 has its gate connected to its drain, it will act as a constant current source charging capacitor 56 to a logic "1" level over a finite period of time determined by the capacitance of capacitor 56. P-channel transistor 54 while not absolutely required, in effect stabilizes the charging of capacitor 56. Simultaneously, the logic "0" level applied to the gate of N-channel transistor 58 will turn it off allowing capacitor 56 to charge. Concurrently, the logic "0" level on threshold line 50 is inverted by inverter 66 for input of a logic "1" level to AND gate 64. The output of AND gate 64 will remain at its previous "0" level until a logic "1" level is supplied to its other input through the rising of delay output line 60 to a logic "1" level upon the charging of capacitor 56. When it receives a logic "1" level at both of its inputs, AND gate 64 will produce a logic "1" output level for input to level shifter 18 on line 70. As shown in FIG. 3, the $\Delta T_1$ time period between the $\overline{PDNO}$ signal and the rise in either or both of $V_{DD}$ and $V_{CC}$ voltage levels is delayed by the action of delay network 14. Should the delay provided by delay network 14 utilizing an integrated circuit capacitor such as capacitor 56 be insufficient, optional pad 62 allows the connection of an external capacitor 72 in parallel with capacitor 56 to increase the time period $\Delta T_1$.

In the embodiment above described, comparators 38 and 40 are conventional CMOS devices having a low offset such that small differentials between the applied voltages to their input will cause a relatively rapid change in their output state. It is also apparent that while a NOR gate 46 and series connected inverter 48 have been utilized in the CMOS integrated embodiment above-described, their combined function could be fulfilled by a single OR gate in other applications. It should also be noticed that in those applications not utilizing a source of either $V_{DD}$ voltage or $V_{CC}$ voltage, the corresponding comparator might also be eliminated in conjunction with NOR gate 46 and inverter 48. Thus, the principal of the invention is also applicable to those devices using only a single voltage supply and threshold detector 12 would then comprise but a single comparator.

What has been provided therefore, is an improved power sensing circuit and method which can speed up a power down signal to subsequent circuitry while selectively delaying a power up signal. The power sensing circuit and method of the present invention can sense and react to a plurality of supply voltages and may be readily integrated onto a semiconductor substrate using standard CMOS technology.

I claim:

1. A power sensing circuit operable from a supply voltage line having a variable signal level applied thereto, said circuit for providing a power up signal after a predetermined delay period following restoration of said variable signal level to a reference signal level and a power down signal when said variable signal level drops below said reference signal level comprising:
   a threshold detector having as inputs said reference signal level and said variable signal level, said threhold detector producing a first output signal when said variable signal level rises to said reference signal level and a second output signal when said variable signal level falls below said reference signal level;
   a delay network operably coupled to said threshold detector and providing a delay output signal upon receiving said first output signal; and
   gating means responsive to said first, second and delay output signals for providing said power up signal in response to said first and delay output signals and said power down signal in response to said second output signal.

2. The power sensing circuit of claim 1 wherein said threhold detector comprises at least one comparator having as inputs said reference signal level and said variable signal level.

3. The power sensing circuit of claim 1 wherein said reference and variable signal levels are voltage levels.

4. The power sensing circuit of claim 1 wherein said delay network comprises a switched current source for alternately charging and discharging a capacitor.

5. The power sensing circuit of claim 4 wherein said capacitor is an integrated circuit capacitor.

6. The power sensing circuit of claim 1 wherein said gating means comprises an AND gate.

7. The power sensing circuit of claim 1 further comprising a level shifter operably coupled to said gating means for increasing the gain of said power up and power down signals.

8. A method for sensing the level of power applied to a circuit operable from a supply voltage line having a variable signal level applied thereto, said method for providing a power up signal after a predetermined delay period following restoration of said variable signal level to a reference signal level and a power down signal when said variable signal level drops below said reference signal level, said method comprising the steps of:

furnishing said reference signal level;

comparing said variable signal level to said reference signal level;

producing a first output signal when said variable signal level rises to said reference signal level and a second output signal when said variable signal level falls below said reference signal level;

generating a delay output signal in response to said first output signal; and alternately gating said first and second output signals with said delay output signal such that a first control signal is produced when said delay output signal is equal to said first output signal and a second control signal is produced when said second output signal is supplied.

9. The method of claim 8 wherein said steps of comparing and producing are carried out by means of a comparator.

10. The method of claim 8 wherein said step of generating further comprises the step of charging a capacitor to produce said delay output signal.

11. The method of claim 8 wherein said step of alternately gating is carried out by means of an AND grate having as inputs said delay output signal alternately with said first and second output signals.

12. The method of claim 8 further comprising the step of increasing the gain of the said first and second control signals.

* * * * *